US010429751B2

(12) United States Patent
Lu et al.

(10) Patent No.: US 10,429,751 B2
(45) Date of Patent: Oct. 1, 2019

(54) ALIGNMENT MARK SEARCHING METHOD, DISPLAY SUBSTRATE AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Chaohua Lu, Beijing (CN); Yongliang Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 307 days.

(21) Appl. No.: 15/505,193

(22) PCT Filed: Aug. 22, 2016

(86) PCT No.: PCT/CN2016/096183
§ 371 (c)(1),
(2) Date: Feb. 20, 2017

(87) PCT Pub. No.: WO2017/071382
PCT Pub. Date: May 4, 2017

(65) Prior Publication Data
US 2017/0261868 A1    Sep. 14, 2017

(30) Foreign Application Priority Data
Oct. 30, 2015   (CN) .......................... 2015 1 0725969

(51) Int. Cl.
*G03F 9/00*  (2006.01)
*G03F 7/00*  (2006.01)
*G06K 9/32*  (2006.01)

(52) U.S. Cl.
CPC .......... *G03F 9/7088* (2013.01); *G03F 7/0007* (2013.01); *G03F 9/7076* (2013.01);
(Continued)

(58) Field of Classification Search
USPC ..... 235/494; 250/559.36; 257/E23.179, 390; 345/156; 348/87, 95; 355/53; 356/401;
(Continued)

(56) References Cited

U.S. PATENT DOCUMENTS 6,858,441 B2 * 2/2005 Nuetzel ................. H01L 23/544
257/E23.179
6,925,203 B1 * 8/2005 Tanaka ................... G03F 9/7088
250/559.36
(Continued)

FOREIGN PATENT DOCUMENTS

CN   1188328 A   7/1998
CN   1936710 A   3/2007
(Continued)

OTHER PUBLICATIONS

First Chinese Office Action dated Nov. 11, 2016; Appln. No. 201510725969.X.
(Continued)

*Primary Examiner* — Xuemei G Chen
(74) *Attorney, Agent, or Firm* — Ladas & Parry LLP

(57) ABSTRACT

An alignment mark searching method is for searching an alignment mark on a base substrate, a first positioning line segment is formed in a dummy region of the base substrate, and a straight line where the first positioning line segment is positioned running through the alignment mark. The method includes: acquiring theoretical coordinates of the alignment mark; moving a detection system view field to a target position with the theoretical coordinates as a target; moving the detection system view field from the target position in a
(Continued)

direction perpendicular to the first positioning line segment until the first positioning line segment appears in the detection system view field; and moving the detection system view field from the position of the first positioning line segment in a length direction of the first positioning line segment until the alignment mark appears in the detection system view field. The method achieves an effect that the alignment mark can be simply, conveniently and rapidly searched. A display substrate and a display apparatus are further disclosed.

19 Claims, 6 Drawing Sheets

(52) U.S. Cl.
CPC ......... *G03F 9/7084* (2013.01); *G06K 9/3216* (2013.01); *G06K 2009/3225* (2013.01)

(58) Field of Classification Search
USPC ................. 382/151; 428/195.1; 430/311
See application file for complete search history.

(56) References Cited

U.S. PATENT DOCUMENTS

| | | | |
|---|---|---|---|
| 7,006,225 | B2 | 2/2006 | Tanaka |
| 7,648,885 | B2 | 1/2010 | Sato |
| 9,347,769 | B2* | 5/2016 | Li ........................... G01B 11/14 |
| 2003/0174330 | A1* | 9/2003 | Tanaka .................. G03F 9/7011 356/401 |
| 2003/0235330 | A1* | 12/2003 | Tanaka .................. G03F 9/7084 382/151 |
| 2004/0169833 | A1* | 9/2004 | Tanaka .................. G03B 27/42 355/53 |
| 2004/0189995 | A1* | 9/2004 | Tanaka .................. G03F 9/7003 356/401 |
| 2004/0239625 | A1* | 12/2004 | Huang .................... G09G 3/006 345/156 |
| 2008/0000991 | A1* | 1/2008 | Yin ......................... G06K 1/123 235/494 |
| 2009/0042139 | A1* | 2/2009 | Shiraishi ............. G03F 7/70266 430/311 |
| 2014/0300016 | A1* | 10/2014 | Sato ....................... G03F 7/0002 264/40.1 |
| 2015/0017397 | A1* | 1/2015 | Tsujita .................. G03F 7/2051 428/195.1 |
| 2015/0262350 | A1* | 9/2015 | Lin ..................... G02B 13/0015 348/87 |
| 2015/0294995 | A1* | 10/2015 | Wang .................... G02F 1/1345 257/390 |
| 2016/0203378 | A1* | 7/2016 | Wang .................. G06K 9/00671 348/95 |
| 2018/0151400 | A1* | 5/2018 | Wang ..................... H01L 21/68 |

FOREIGN PATENT DOCUMENTS

| | | |
|---|---|---|
| CN | 102063016 A | 5/2011 |
| CN | 102800654 A | 11/2012 |
| CN | 103197505 A | 7/2013 |
| CN | 105182702 A | 12/2015 |
| JP | 0276214 A | 3/1990 |
| JP | 06305554 A | 11/1994 |
| JP | 09283426 A | 10/1997 |

OTHER PUBLICATIONS

International Search Report and Written Opinion dated Nov. 29, 2016; PCT/CN2016/096183.

* cited by examiner

ALIGNMENT MARK SEARCHING METHOD, DISPLAY SUBSTRATE AND DISPLAY APPARATUS

TECHNICAL FIELD

Embodiments of the present disclosure relate to an alignment mark searching method, a display substrate and a display apparatus.

BACKGROUND

When a patterning process is carried out, generally an exposure machine is needed to expose photoresist. When exposure is carried out, a mask and a base substrate need to be aligned by means of an alignment mark positioned in a dummy region on the base substrate so as to ensure accuracy in the exposure process. The alignment mark can be of a rectangular or round shape.

SUMMARY

A first aspect of the present disclosure provides an alignment mark searching method, for searching an alignment mark on a base substrate, a first positioning line segment being formed in a dummy region of the base substrate, and a straight line where the first positioning line segment is positioned running through the alignment mark; the method comprises: acquiring theoretical coordinates of the alignment mark; moving a detection system view field to a target position with the theoretical coordinates as a target; moving the detection system view field from the target position in a direction perpendicular to the first positioning line segment until the first positioning line segment appears in the detection system view field; and moving the detection system view field from the position of the first positioning line segment in a length direction of the first positioning line segment until the alignment mark appears in the detection system view field.

For example, the straight line where the first positioning line segment is positioned runs through a center of the alignment mark, and after the moving the detection system view field from the target position in the direction perpendicular to the first positioning line segment until the first positioning line segment appears in the detection system view field, the method further comprises: moving the detection system view field to enable the center of the detection system view field to be positioned on the first positioning line segment For example, a distance between the first positioning line segment and the alignment mark in a length direction of the first positioning line segment is less than a width of the detection system view field in the length direction of the first positioning line segment.

For example, a second positioning line segment is also formed in the dummy region of the base substrate, and straight lines where the first positioning line segment and the second positioning line segment are positioned coincide with each other and are respectively positioned on both sides of the alignment mark.

For example, the detection system view field is of a rectangular shape, and a distance between the first positioning line segment and the second positioning line segment is greater than or equal to a length of the detection system view field in the length direction of either of the first positioning line segment and the second positioning line segment.

For example, the first positioning line segment and the alignment mark are formed in a single patterning process.

For example, the base substrate is configured to be a base substrate in an array substrate or a base substrate in a color filter substrate.

For example, the method is used in a patterning process for the base substrate.

A second aspect of the present disclosure provides a display substrate, comprising a base substrate, wherein a first positioning line segment is formed in a dummy region of the base region, and a straight line where the first positioning line segment is positioned runs through an alignment mark.

For example, the straight line where the first positioning line segment is positioned runs through a center of the alignment mark.

For example, a distance between the first positioning line segment and the alignment mark in a length direction of the first positioning line segment is less than a width of a detection system view field in the length direction of the first positioning line segment.

For example, a second positioning line segment is also formed in the dummy region of the base substrate, and straight lines where the first positioning line segment and the second positioning line segment are positioned coincide with each other and are respectively positioned on both sides of the alignment mark.

For example, a distance between the first positioning line segment and the second positioning line segment is greater than or equal to a length of the detection system view field in the length direction of either of the first positioning line segment and the second positioning line segment.

For example, the first positioning line segment and the alignment mark are formed in a single patterning process.

For example, the display substrate comprises: an array substrate or a color filter substrate.

A third aspect of the present disclosure provides a display apparatus, comprising any one of the above described display substrates.

It should be understood that the foregoing general descriptions and later detailed descriptions merely are exemplary and explanatory, and not intended to limit the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 2-1 is a flow chart of another alignment mark searching method disclosed by an embodiment of the present disclosure;

FIG. 2-2 to FIG. 2-6 are schematic diagrams of a dummy region of a base substrate in a display substrate in the embodiment shown in FIG. 2-1;

FIG. 3-1 is a schematic diagram of a dummy region of a base substrate in a display substrate disclosed by an embodiment of the present disclosure;

FIG. 3-2 is a schematic diagram of a dummy region of a base substrate in another display substrate disclosed by an embodiment of the present disclosure; and FIG. 3-3 is a schematic diagram of a dummy region of a base substrate in yet another display substrate disclosed by an embodiment of the present disclosure.

DETAILED DESCRIPTION

Figure 1:
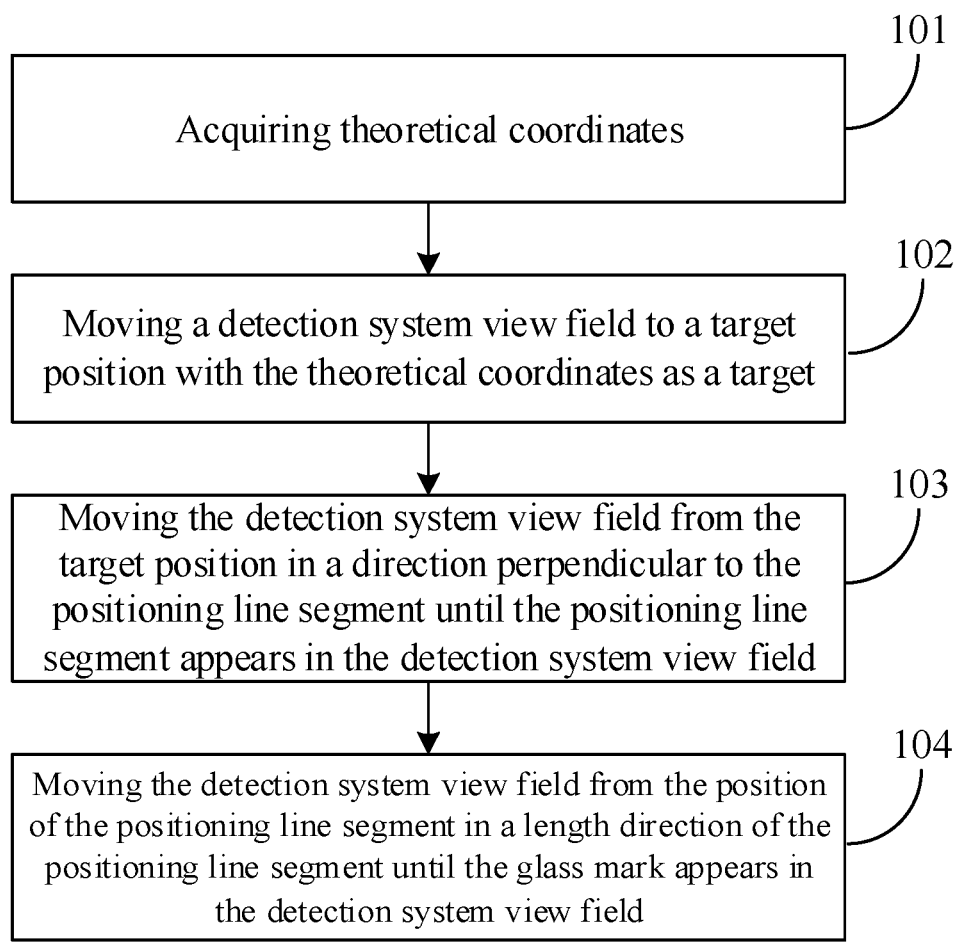
FIG. 1 is a flow chart of an alignment mark searching method disclosed by an embodiment of the present disclosure.

Exemplary embodiments will be illustrated in details herein, and examples of the exemplary embodiments are expressed in the drawings. When the descriptions below are related to the drawings, unless otherwise defined, same numbers in different drawings represent the same or similar elements. Embodiments described in the exemplary embodiments below do not represent all embodiments consistent with the present disclosure. In contrast, the embodiments merely are examples of apparatuses and methods, which are consistent with some aspects of the present disclosure as shown in descriptions in the appended claims.

According to an alignment mark searching method, firstly, theoretical coordinates of an alignment mark are acquired, and then according to the theoretical coordinates, a detection system view field (the detection system view field is a window for an exposure machine to search the alignment mark, the entire alignment mark can be observed by the window, and when the alignment mark appears in the window, it shows that the exposure machine finds the alignment mark) is moved. Due to a mechanical error of the exposure machine, a certain error may exist between actual coordinates of the moved detection system view field on a substrate and the theoretical coordinates, so that the detection system view field needs to be moved towards all directions around the actual coordinates of the detection system view field to locate the alignment mark.

In the research process, the inventors find that the alignment mark searching method at least has the following defects that: in the mode, the detection system view field needs to be moved towards all the directions around the actual coordinates to find the alignment mark, the searching process is relatively complex, and searching time is relatively long.

FIG. 1 is a flow chart of an alignment mark searching method disclosed by an embodiment of the present disclosure. The embodiment is illustrated by taking the case of applying the alignment mark searching method to search an alignment mark on a base substrate as an example, and a positioning line segment is formed in a dummy region of the base substrate. The alignment mark searching method can include the following operations:

S101: acquiring theoretical coordinates.

S102: moving a detection system view field to a target position with the theoretical coordinates as a target.

S103: moving the detection system view field from the target position in a direction perpendicular to the positioning line segment until the positioning line segment appears in the detection system view field.

S104: moving the detection system view field from the position of the positioning line segment in a length direction of the positioning line segment until the alignment mark appears in the detection system view field.

According to the alignment mark searching method provided by the embodiment of the present disclosure, the positioning line segment is searched in the dummy region of the base substrate first, and the alignment mark is searched along the length direction of the positioning line segment; here a straight line where the positioning line segment is positioned runs through the alignment mark. The method overcomes the problems of relatively complex searching process and avoids relatively long searching time, which are caused by the case that in the above-mentioned method, the detection system view field needs to be moved towards all the directions around the actual coordinates to find the alignment mark; and the method achieves an effect that the alignment mark can be simply, conveniently and rapidly searched.

Figures 1, 2:
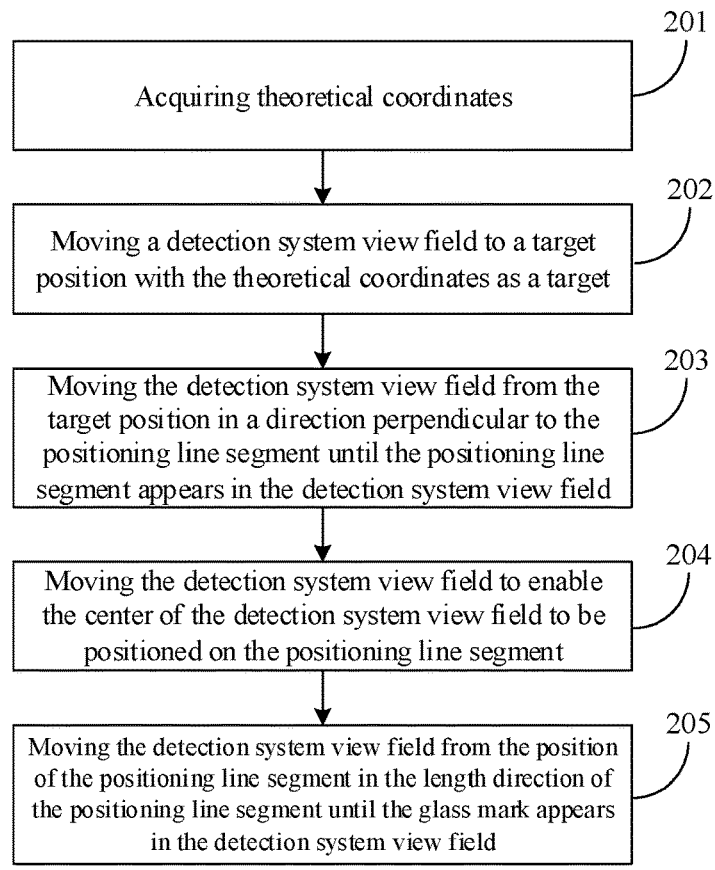
Figure 2:
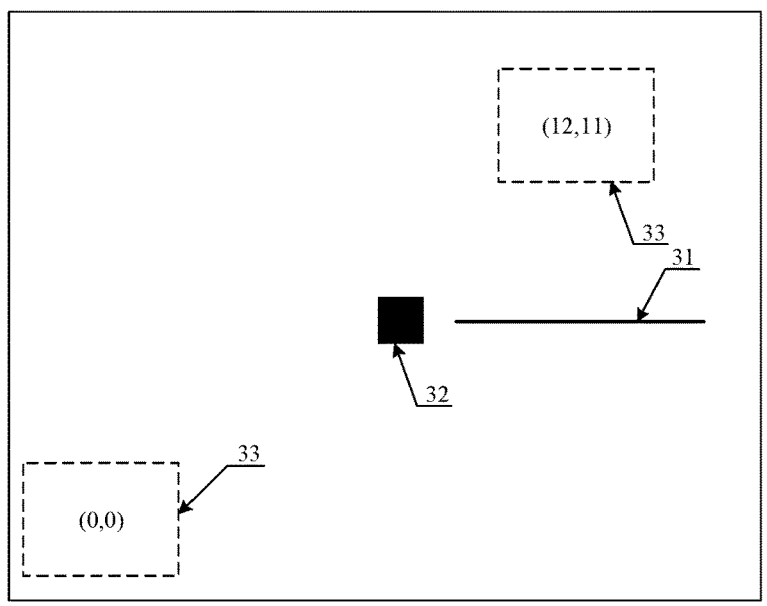

FIG. 2-1 is a flow chart of another alignment mark searching method disclosed by an embodiment of the present disclosure. The embodiment is illustrated by taking the case of applying the alignment mark searching method to search an alignment mark on a base substrate on a display substrate as an example; a positioning line segment is formed in a dummy region of the base substrate. The alignment mark searching method can include the following operations:

S201: acquiring theoretical coordinates.

When the alignment mark searching method provided by the embodiment of the present disclosure is applied, the theoretical coordinates can be acquired firstly, the theoretical coordinates are coordinates of the alignment mark on the base substrate, and the theoretical coordinates can be known in advance, for example, determined in the design process of the base substrate.

S202: moving a detection system view field to a target position with the theoretical coordinates as a target.

After the theoretical coordinates of the alignment mark on the base substrate are known, the detection system view field of an exposure machine can be moved to the target position by using the theoretical coordinates as the target, and after the detection system view field is moved to the target position, due to reasons of a mechanical error and the like, a certain error may exist between a position of the detection system view field and a position of the alignment mark, i.e., the alignment mark possibly does not appear in the detection system view field as expected.

Exemplarily, as shown in FIG. 2-2, the theoretical coordinates of the alignment mark 32 are (10, 10), the detection system view field 33 is initially positioned at coordinates (0, 0), and when the detection system view field 33 is moved with the theoretical coordinates (10, 10) as the target, the detection system view field can be firstly moved upwards by 10 unit lengths and then moved leftwards by 10 unit lengths. However, due to factors of the mechanical error or the like, the actual moving distances generated when the detection system view field moves rightwards and moves upwards possibly are not 10 unit lengths. For example, the actual coordinates of the target position after the detection system view field 33 is moved possibly are (12, 11), and the detection system view field 33 does not find the alignment mark 32. A line segment 31 in FIG. 2-2 is the positioning line segment. In the embodiment in the drawing, one positioning line segment (a first positioning line segment) is provided. In a comparative method, in this case, the position of the detection system view field relative to the alignment mark cannot be known, and thus, when the alignment mark is searched, the detection system view field needs to be moved towards all the directions, the searching process is relatively complex, and consumed time is relatively long.

Optionally, the detection system view field is of a rectangular shape, the rectangle is larger than the alignment mark, and the alignment mark can entirely appear in the detection system view field. It should be noted that the display substrate to which the embodiment of the present disclosure relates can be an array substrate or a color filter substrate, and the alignment mark searching method provided by the embodiment of the present disclosure is generally applied to the color filter substrate.

It should be noted that the coordinates of the detection system view field to which the embodiment of the present disclosure relates can be coordinates of one point on the detection system view field, for example, when the detection system view field is of a rectangular shape, the coordinates of one vertex of the rectangle can be used as the coordinates of the detection system view field, or the coordinates of the center of the rectangle can be used as the coordinates of the detection system view field, and the coordinates of the alignment mark are similar to the coordinates of the detection system view field, which are not limited in the embodiment of the present disclosure.

S203: moving the detection system view field from the target position in a direction perpendicular to the positioning line segment until the positioning line segment appears in the detection system view field.

Figures 2, 3:
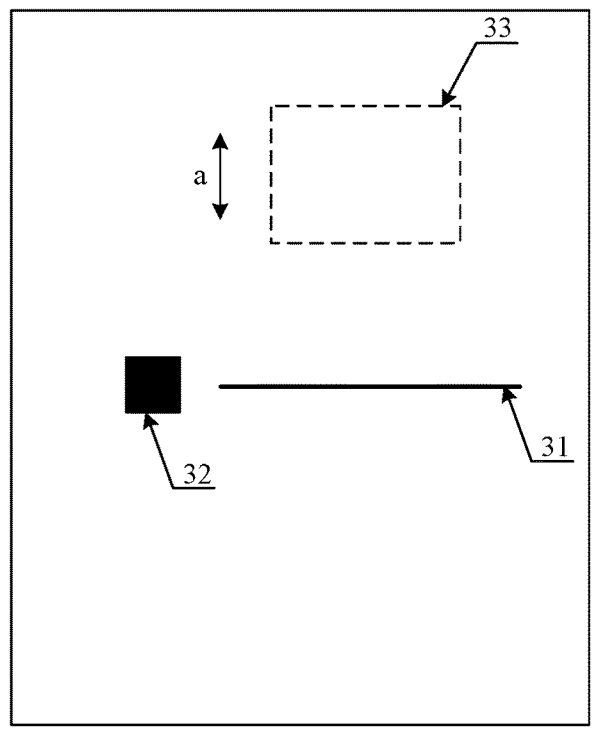

After the detection system view field is moved to the target position, the detection system view field can be moved from the target position in the direction perpendicular to the positioning line segment until the positioning line segment appears in the detection system view field. The positioning line segment is arranged on the base substrate in the embodiment of the present disclosure, and thus, after the detection system view field is moved to the target position, as long as the detection system view field is moved along the direction perpendicular to the positioning line segment, the positioning line segment can be searched out. As shown in FIG. 2-3, the positioning line segment 31 can be searched out by moving the detection system view field 33 along a direction a perpendicular to the positioning line segment, the positioning line segment 31 can be found by moving the detection system view field 33 towards two directions at most, and the searching process becomes simple, rapid and convenient When the detection system view field 33 is moved in the direction a perpendicular to the positioning line segment, a maximum error of the target position of the detection system view field 33 and the alignment mark 32 in the direction a can be considered. Exemplarily, the maximum error is equal to 3 unit lengths. The detection system view field can be firstly moved from the target position in one direction perpendicular to the positioning line segment by 3 unit lengths, and if the positioning line segment is not found, then the detection system view field is moved from the target position in the other direction perpendicular to the positioning line segment to search the positioning line segment.

Moreover, the positioning line segment and the alignment mark can be formed in a single patterning process.

Optionally, two positioning line segments can be arranged, straight lines where the two positioning line segments are positioned coincide with each other, and the two positioning line segments are positioned on both sides of the alignment mark respectively. This can ensure that after the detection system view field is moved to the target position, whether the detection system view field is towards the left side or the right side of the alignment mark, the positioning line segment can be found when the detection system view field is moved in the direction perpendicular to the positioning line segments, so that the applicability of the alignment mark searching method provided by the embodiment of the present disclosure is improved.

It should be noted that when each positioning line segment is arranged on ether side of the alignment mark, a distance between two positioning line segments is greater than or equal to a length of the detection system view field in a length direction of either of the positioning line segments. This is to ensure that when the detection system view field is moved in the length direction of the positioning line segment to search the alignment mark, the alignment mark can separately appear in the detection system view field so as to prevent interference generated by the positioning line segment on identifying the alignment mark.

It also should be noted that a distance between the positioning line segment and the alignment mark in the length direction of the positioning line segment can be less than a width of the detection system view field in the length direction of the positioning line segment. Therefore, the influence on identifying the alignment mark by the exposure machine, which is caused by the case that the positioning line segment and the alignment mark simultaneously disappear from the detection system view field when the detection system view field is moved in the length direction of the positioning line segment, can be avoided.

S204: moving the detection system view field to enable the center of the detection system view field to be positioned on the positioning line segment.

After the positioning line segment appears in the detection system view field, the detection system view field can be moved, so that the center of the detection system view field is positioned on the positioning line segment. The detection system view field is intended to search and accurately identify the alignment mark, and thus, the alignment mark needs to entirely appear in the detection system view field, and the operation of enabling the center of the detection system view field to be positioned on the positioning line segment can facilitate the detection system view field identifying the alignment mark later. Similarly, when the positioning line segment is arranged, an extension line of the positioning line segment also can be arranged to run through the center of the alignment mark so as to cooperate with search of the detection system view field.

S205: moving the detection system view field from the position of the positioning line segment in the length direction of the positioning line segment until the alignment mark appears in the detection system view field.

After the center of the detection system view field is positioned on the positioning line segment, the detection system view field can be moved in the length direction of the positioning line segment until the alignment mark appears the detection system view field. The straight line where the positioning line segment is positioned runs through the alignment mark, the detection system view field is larger than the alignment mark and the center of the detection system view field is positioned on the positioning line segment, and thus, when being moved in the length direction of the positioning line segment, the detection system view field can find the alignment mark. The detection system view field can identify the alignment mark by a method (i.e., analysis on a contrast of an image and the like) such as image analysis or the like when the alignment mark appears in the detection system view field.

Figures 2, 3, 4:
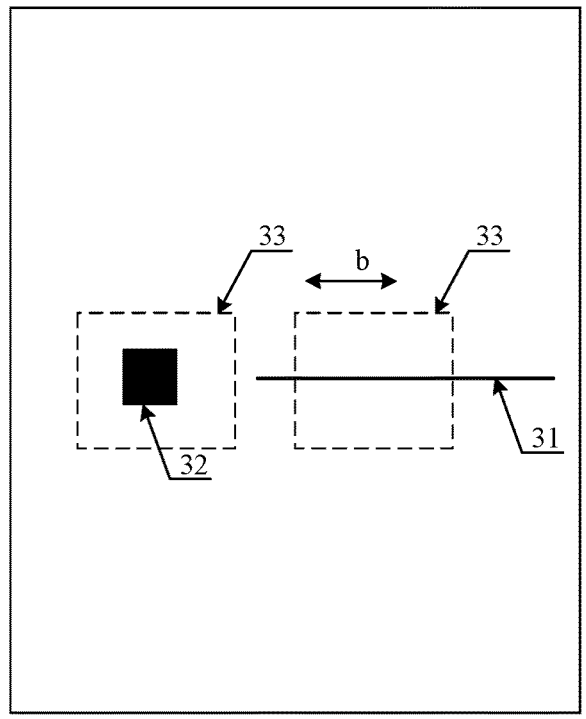
Figures 2, 3, 4, 5:
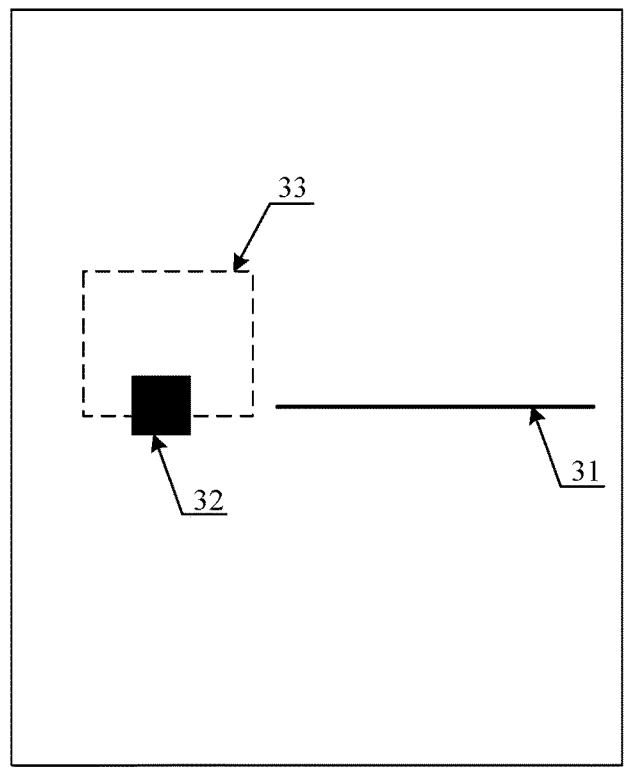
Figures 2, 3, 4, 5, 6:
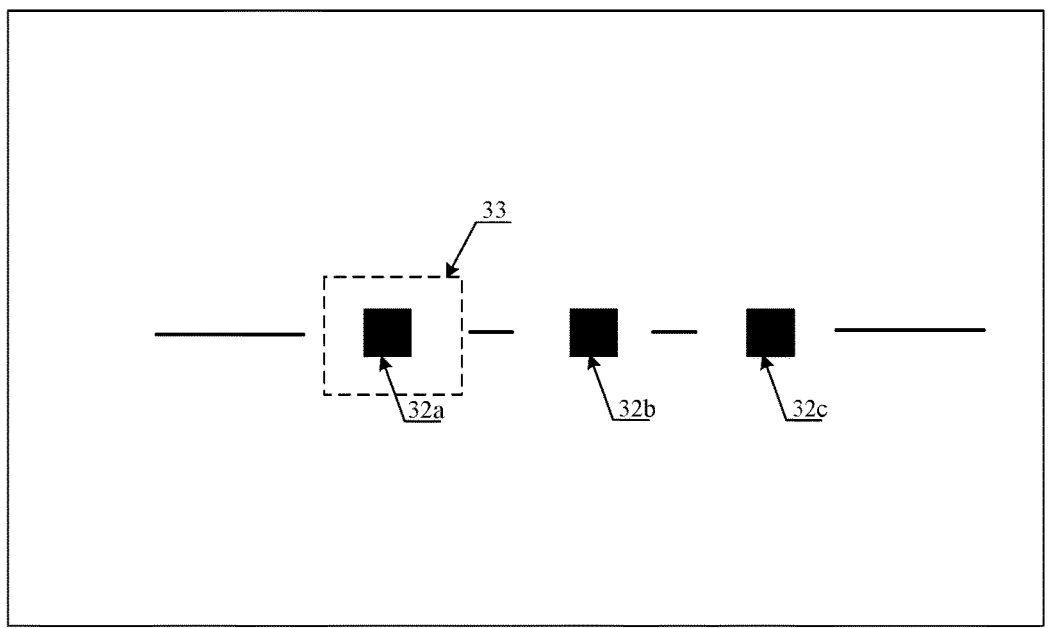
Figures 1, 3:
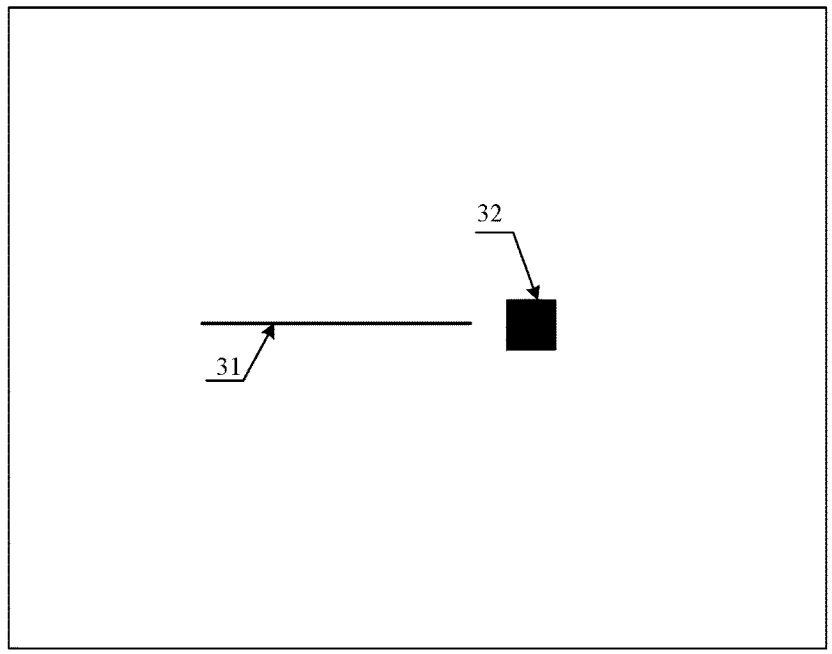
Figures 2, 3:
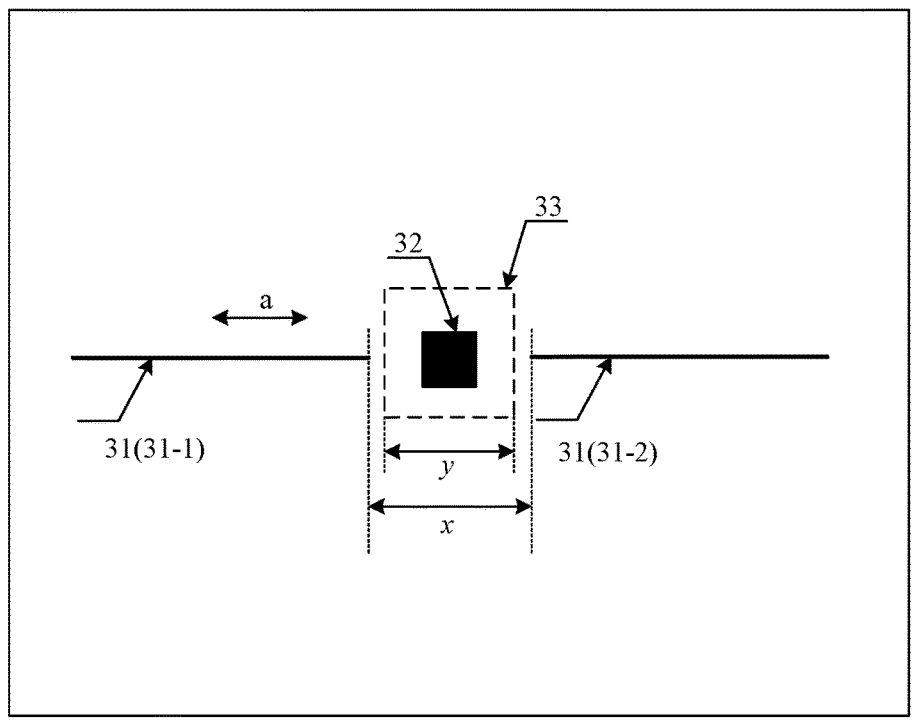
Figure 3:
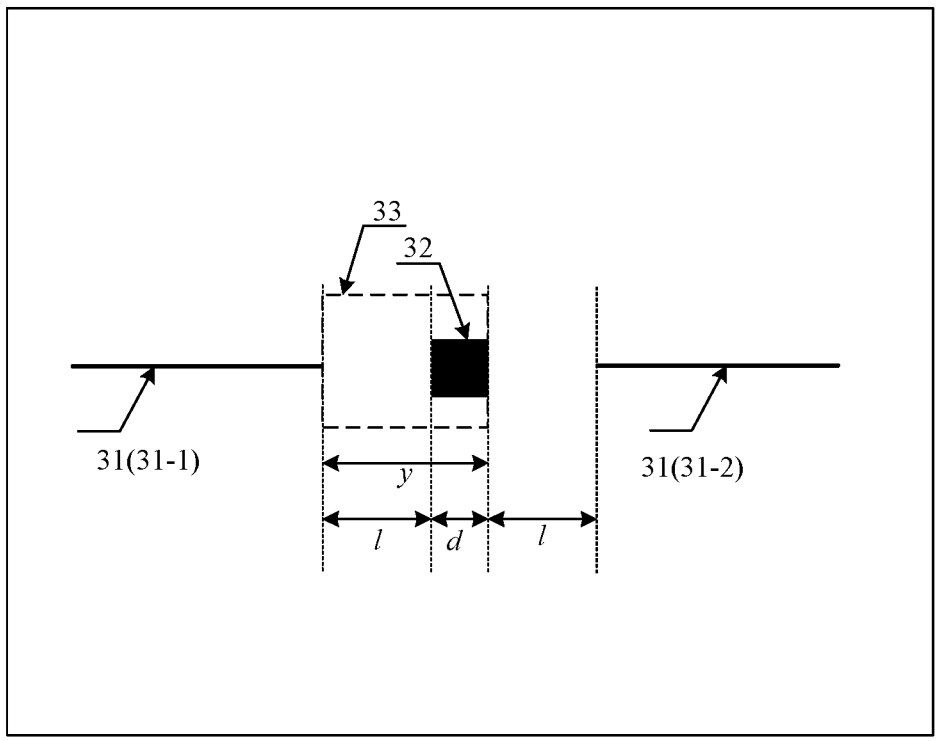

Exemplarily, as shown in FIG. 2-4, the detection system view field 33 is moved in a length direction b of the positioning line segment 31, and the alignment mark 32 will appear in the detection system view field 33. When the detection system view field is moved, a positional relationship between the alignment mark and the detection system view field possibly is not determined, and thus, the detection system view field can be moved in two directions of the length direction of the positioning line segment. In the moving process, a maximum deviation of positions of the detection system view field and the alignment mark in the length direction of the positioning line segment can be considered, and exemplarily, if the maximum deviation is equal to 5 unit lengths, the detection system view field can be firstly moved from an initial position in one direction of a length of the positioning line segment by 5 unit lengths. If the alignment mark is not searched out, the detection system view field is moved towards the other direction of the length of the positioning line segment from the initial position to continue to search the alignment mark.

It should be noted that as shown in FIG. 2-5, if the center of the detection system view field 33 is not moved onto the positioning line segment 31, when the detection system view field 33 is moved in the length direction of the positioning line segment 31 to search the alignment mark 32, the alignment mark 32 possibly cannot completely appear in the detection system view field 33, which possibly will cause a certain influence on identifying the alignment mark.

It should be noted that possibly, a plurality of alignment marks are arranged in the dummy region, and exemplarily, as shown in FIG. 2-6, three alignment marks 32a, 32b and 32c arranged at an equal interval possibly are included in the dummy region, and by taking the case of moving the detection system view field 33 rightwards from the left side of the alignment mark 32a to search the alignment mark as an example, after finding the alignment mark 32a, the detection system view field 33 is continuously moved rightwards, so that the alignment marks 32b and 32c can be found successively.

It should be noted that after the detection system view field finds the alignment mark, a mask can be aligned with the base substrate according to the alignment mark, and processes of exposure and the like are carried out on photoresist on the base substrate, i.e., the alignment mark searching method provided by the embodiment of the present disclosure can be applied to a patterning process and become one part of the patterning process.

It should be noted that the alignment mark searching method provided by the embodiment of the present disclosure further can be applied to search alignment marks in other apparatus, but not limited to search an alignment mark in a display panel.

It should be added that the alignment mark searching method provided by the embodiment of the present disclosure achieves an effect of facilitating the detection system view field identifying the alignment mark by moving the center of the detection system view field onto the positioning line segment after the detection system view field finds the positioning line segment.

From the above, according to the alignment mark searching method provided by the embodiment of the present disclosure, the positioning line segment is searched in the dummy region of the base substrate, and the alignment mark is searched along the length direction of the positioning line segment; the straight line where the positioning line segment is positioned runs through the alignment mark, which solves the problems of relatively complex searching process and relatively long searching time, which are caused by the case that in the related art, the detection system view field needs to be moved towards all the directions around the actual coordinates to find the alignment mark; and an effect that the alignment mark can be simply, conveniently and rapidly searched is achieved.

FIG. 3-1 is a schematic diagram of a dummy region of a base substrate in a display substrate disclosed by an embodiment of the present disclosure. The dummy region of the base substrate can include a positioning line segment 31 and an alignment mark 32. After extended, a straight line (not shown in FIG. 3-1) where the positioning line segment 31 is positioned can run through the alignment mark 32.

Optionally, the straight line where the positioning line segment 31 is positioned can extend to run through the center of the alignment mark 32.

Optionally, as shown in FIG. 3-2, two positioning line segments 31 of the alignment mark 32 are provided and respectively are a first positioning line segment 31-1 and a second positioning line segment 31-2, straight lines where two positioning line segments 31 are positioned coincide with each other, and two positioning line segments 31 are respectively positioned on both sides of the alignment mark 32. It should be noted that two positioning line segments 31 also can be in a parallel relationship.

Optionally, a distance x between two positioning line segments 31 is greater than or equal to a length y of a detection system view field 33 in a length direction a of either of the positioning line segments. This is to ensure that when the detection system view field 33 is moved in the length direction a of the positioning line segments 31 to search the alignment mark 32, the alignment mark 32 can separately appear in the detection system view field 33 so as to prevent interference generated by simultaneous appearance of the positioning line segment 31 and the alignment mark 32 in the detection system view field 33 on identifying the alignment mark 32 by an exposure machine.

Optionally, FIG. 3-3 is a schematic diagram of a dummy region of a base substrate in yet another display substrate disclosed by an embodiment of the present disclosure. In FIG. 3-3, a distance/between either of the positioning line segments 31 and an alignment mark 32 in a length direction of the positioning line segments 31 is less than a width y of a detection system view field 33 in the length direction of the positioning line segments 31. Therefore, influence on identifying the alignment mark 32 by the exposure machine, which is caused by the case that the positioning line segments 31 and the alignment mark 32 simultaneously disappear from the detection system view field 33 when the detection system view field is moved in the length direction of the positioning line segments 31, can be avoided.

Optionally, the distances between the positioning line segments 31 on both sides of the alignment mark 32 and the alignment mark 32 are equal and are both l, and l+d=y, where d represents a length of the alignment mark 32 in the length direction of the positioning line segments 31, and y represents a length of the detection system view field 33 in the length direction of the positioning line segments 31. When the detection system view field 33 is moved on the positioning line segment 31, the positioning line segment 31 and the alignment mark 32 cannot simultaneously disappear from the detection system view field 33. Therefore, increase of the difficulty in searching the alignment mark, which is caused by the excessively long distance between the positioning line segment and the alignment mark, can be avoided, and when the positioning line segment disappears from the detection system view field, the alignment mark can simultaneously and entirely appear in the detection system view field, so that a speed of searching the alignment mark is improved.

Optionally, the positioning line segments 31 and the alignment mark 32 are formed in a single patterning process. When the positioning line segments 31 and the alignment mark 32 are formed by the single patterning process, the positioning line segments 31 can be added in the dummy region on the basis of not increasing times of the patterning process.

Optionally, the display substrate to which the embodiment of the present disclosure relates can be an array substrate or a color filter substrate. The array substrate can be an array substrate for a Liquid Crystal Display (LCD) apparatus or an Organic Light Emitting Diode (OLED) display apparatus.

It should be noted that the display substrate provided by the embodiment of the present disclosure takes the case that the alignment mark in the dummy region of the base substrate is of a rectangular shape as an example, and the alignment mark also can be of other shapes of circle or the like, which is not limited ill the embodiment of the present disclosure.

It should be noted that the base substrate shown in FIG. 3-1 also can be a substrate with the alignment mark in other apparatus, which is not limited in the embodiment of the present disclosure.

It should be added that by enabling the distance between the positioning line segment and the alignment mark to be less than the width of the detection system view field, the display substrate provided by the embodiment of the present disclosure achieves an effect of avoiding influence on identification of the exposure machine on the alignment mark, which is caused by simultaneous disappear of the positioning line segment and the alignment mark from the detection system view field.

It should be added that by setting a distance between two positioning line segments to be greater than or equal to the length of the detection system view field in the length direction of either of the positioning line segments, the display substrate provided by the embodiment of the present disclosure achieves an effect of avoiding interference of the positioning line segments on identifying the alignment mark by the exposure machine.

From the above, according to the display substrate provided by the embodiment of the present disclosure, the positioning line segments are arranged in the dummy region of the base substrate, and the straight lines where the positioning line segments are positioned runs through the alignment mark, so that the alignment mark can be searched by positioning the mark, and thus, the problem of difficulty in searching the alignment mark of the base substrate of the display substrate in the related art is solved; and an effect that the alignment mark on the base substrate can be simply, conveniently and rapidly searched is achieved.

Moreover, an embodiment of the present disclosure further provides a display apparatus. The display apparatus can include the display substrate as shown in FIG. 3-1, the display substrate as shown in FIG. 3-2 or the display substrate as shown in FIG. 3-3.

The foregoing embodiments merely are preferred embodiments of the disclosure, and not intended to define the disclosure. Any modification, equivalent replacement, improvement and the like without departure from the spirit and principle of the disclosure shall fall within the scope of the disclosure.

The present application claims priority of the Chinese Patent Application No. 201510725969.X filed on Oct. 30, 2015, the disclosure of which are incorporated herein by its reference in its entirety as part of the present application.

What is claimed is:

1. An alignment mark searching method, for searching an alignment mark on a base substrate, a first positioning line segment being formed in a dummy region of the base substrate, and a straight line where the first positioning line segment is positioned running through the alignment mark, the method comprising:
   acquiring theoretical coordinates of the alignment mark;
   moving a detection system view field to a target position with the theoretical coordinates as a target;
   moving the detection system view field from the target position in a direction perpendicular to the first positioning line segment until the first positioning line segment appears in the detection system view field; and
   moving the detection system view field from the position of the first positioning line segment in a length direction of the first positioning line segment until the alignment mark appears in the detection system view field.

2. The method according to claim 1, wherein the straight line where the first positioning line segment is positioned runs through a center of the alignment mark, and after the moving the detection system view field from the target position in the direction perpendicular to the first positioning line segment until the first positioning line segment appears in the detection system view field, the method further comprises:
   moving the detection system view field to enable the center of the detection system view field to be positioned on the first positioning line segment.

3. The method according to claim 2, wherein the base substrate is configured to be a base substrate in an array substrate or a base substrate in a color filter substrate.

4. The method according to claim 2, wherein the method is used in a patterning process for the base substrate.

5. The method according to claim 1, wherein
   a distance between the first positioning line segment and the alignment mark in a length direction of the first positioning line segment is less than a width of the detection system view field in the length direction of the first positioning line segment.

6. The method according to claim 1, wherein
   a second positioning line segment is also formed in the dummy region of the base substrate, and straight lines where the first positioning line segment and the second positioning line segment are positioned coincide with each other and are respectively positioned on both sides of the alignment mark.

7. The method according to claim 6, wherein the detection system view field is of a rectangular shape, and
   a distance between the first positioning line segment and the second positioning line segment is greater than or equal to a length of the detection system view field in the length direction of either of the first positioning line segment and the second positioning line segment.

8. The method according to claim 6, wherein the base substrate is configured to be a base substrate in an array substrate or a base substrate in a color filter substrate.

9. The method according to claim 6, wherein the method is used in a pattering process for the base substrate.

10. The method according to claim 1, wherein
    the first positioning line segment and the alignment mark are formed in a single patterning process.

11. The method according to claim 1, wherein the base substrate is configured to be a base substrate in an array substrate or a base substrate in a color filter substrate.

12. The method according to claim 1, wherein the method is used in a patterning process for the base substrate.

13. A display substrate, comprising a base substrate, wherein a first positioning line segment is formed in a dummy region of the base substrate, and a straight line where the first positioning line segment is positioned runs through an alignment mark;
    a distance between the first positioning line segment and the alignment mark in a length direction of the first positioning line segment is less than a width of a detection system view field for detecting the alignment mark in the length direction of the first positioning line segment.

14. The display substrate according to claim 13, wherein the straight line where the first positioning line segment is positioned runs through a center of the alignment mark.

15. The display substrate according to claim 13, wherein a second positioning line segment is also formed in the dummy region of the base substrate, and straight lines where the first positioning line segment and the second positioning line segment are positioned coincide with each other and are respectively positioned on both sides of the alignment mark.

16. The display substrate according to claim 15, wherein a distance between the first positioning line segment and the second positioning line segment is greater than or equal to a length of the detection system view field in the length direction of either of the first positioning line segment and the second positioning line segment.

17. The display substrate according to claim 13, wherein the first positioning line segment and the alignment mark are formed in a single patterning process.

18. The display substrate according to claim 13, comprising:
an array substrate or a color filter substrate.

19. A display apparatus, comprising a display substrate, wherein display substrate comprises a base substrate, a first positioning line segment is formed in a dummy region of the base substrate, and a straight line where the first positioning line segment is positioned runs through an alignment mark;
a distance between the first positioning line segment and the alignment mark in a length direction of the first positioning line segment is less than a width of a detection system view field for detecting the alignment mark in the length direction of the first positioning line segment.

* * * * *